United States Patent
Razeghi

(10) Patent No.: US 7,682,865 B2
(45) Date of Patent: Mar. 23, 2010

(54) SUPERLATTICE PHOTODIODES WITH POLYIMIDE SURFACE PASSIVATION

(75) Inventor: Manijeh Razeghi, Evanston, IL (US)

(73) Assignee: MP Technologies, LLC, Wilmette, IL (US)

( * ) Notice: Subject to any disclaimer, the term of this patent is extended or adjusted under 35 U.S.C. 154(b) by 142 days.

(21) Appl. No.: 12/136,446

(22) Filed: Jun. 10, 2008

(65) Prior Publication Data

US 2009/0302309 A1 Dec. 10, 2009

(51) Int. Cl.
H01L 21/00 (2006.01)
H01L 29/00 (2006.01)

(52) U.S. Cl. .......................................... 438/93; 257/428
(58) Field of Classification Search ........................ None
See application file for complete search history.

(56) References Cited

U.S. PATENT DOCUMENTS 5,972,807 A * 10/1999 Tani et al. ...................... 442/63

OTHER PUBLICATIONS

Aaron Gin et al., "Passivation of type II InAs / GaSb superlattice photodiodes", Thin Solid Films, 447-448 (2004) 489-492.*
Gin et al., *Ammonium sulfide passivation of type-II InAs/GaSb superlattice photodiodes*, Applied Physics Letters, vol. 84, No. 12 Mar. 22, 2004.
Hood et al., *On the performance and surface passivation of type II InAs/GaSb superlattice photodiodes for the very-long-wavelength infrared*, Applied Physics Letters 87. 151113 (2005).
Nguyen et al., *Techniques for High-Quality $SiO_2$ Films*, Pro. of SPIE vol. 6479, 64791K1-K8 (2007).
Rehm et al., "Passivation of InAs/(GaIn) Sb short-period superlattice photodiodes with 10 μm cutoff wavelength by epitaxial overgrowth with $Al_xGa_{1-x}As_ySb_{1-y}$. Applied Physics Letters 86, 173501 (2005).
Ravi et al., *Silicon nitride and polyimide capping layers on InGaAs/inP PIN Photodetector after sulfur treatment*, Journal of Crystal Growth 268 (2004) 359-363.
Yeats et al., *Polyimide passivation of In0.53Ga0.47AS, InP, and InGaAsP/InP p-n junction*, Appl. Phys. Lett. 44(1) 145-147, Jan. 1, 1984.
Ng et al., *Slow Transients in polyimide-passivated InP-InGaAs HBT's: Effects of UV Irradiation*, Thermal Annealing and Electrical Stress, IEEE Transactions on Electron Devices, vol. 51, No. 8, Aug. 2004.
Schvartzman et al., *Surface pasivation of (100) InP by organic thiols and polyimide as characterized by stead-state photoluminescence*, Semicond. Sci. Technol. 16 (2001) L68-L71.

(Continued)

*Primary Examiner*—Scott B Geyer
(74) *Attorney, Agent, or Firm*—Husch Blackwell Sanders Welsh & Katz

(57) ABSTRACT

The subject invention comprises the realization of a superlattice photodiode with polyimide surface passivation. Effective surface passivation of type-II InAs/GaSb superlattice photodiodes with cutoff wavelengths in the long-wavelength infrared is presented. A stable passivation layer, the electrical properties of which do not change as a function of the ambient environment, nor time, can be realized by a solvent-based surface preparation, vacuum desorption, and the application of an insulating polyimide layer.

20 Claims, 4 Drawing Sheets

OTHER PUBLICATIONS

Hsu et al., *Effects of polyimide passivation on the photoluminescence of high-purity epitaxial GaAs*, J. Appl. Phys. 63(3), Feb. 1, 1988.

Li et al., *Passivation of AlGaAsSb/InGaAsSb/GaSb photodiodes using aqueous ($NH_4)_2S$ solution and polyimide encapsulation*, Journal of Applied Physics 97, 104506 (2005).

Hood et al., *High differential resistance type-II InAs/GaSb superlatice photodiodes for the long-wavelength infrared*, Applied Physics Letters 89, 093506 (2006).

Robic et al., *Residual stress in silicon dioxide thin films produced by ion-assisted deposition*, Thin Solid Films 290-291 (1996) 34-39.

Kim et al., *Formation of gold nanoparticles embedded in a polyimide film for nanofloating gate memory*, Applied Physics Letters 90, 123118 (2007).

Jung et al., *Memory effect of ZnO nanocrystals embedded in an insulating polyimide layer*, Applied Physics Letters 88, 112107 (2006).

Hood et al., *Near bulk-limited R0A of long-weavelength infrared type-II InAs/GaSb superlattice photodiodes with polyimide surface passivation*, Applied Physics Letters 90, 233513 (2007).

* cited by examiner

SUPERLATTICE PHOTODIODES WITH POLYIMIDE SURFACE PASSIVATION

This invention was made with Government support under Contract Nos. HQ0006-06-C-7325, HQ0006-06-C-7517 and HQ0006-07-C-7656 awarded by the Missile Defense Agency. The Government has certain rights in the invention.

BACKGROUND OF THE INVENTION

This application relates to Infrared Focal Plane Arrays, and more particularly, to a method for surface passivation that is resistant to aggressive processes. Focal plane array fabrication requires a well passivated material that is resistant to aggressive processes. Type-II InAs/GaSb superlattice heterodiodes have the ability to be more resilient than homojunction diodes in improving sidewall resistivity through the use of various passivation techniques.

The growth of semiconductor III-V compounds by chemical vapor deposition (CVD) using organometallics and hydrides as elemental sources has recently developed into a viable process with many potential commercial applications. The metallo-organic chemical vapor deposition (MOCVD) process, based on the pyrolysis of alkyls of group-III elements in an atmosphere of the hydrides of group-V elements, is a common growth technique because it is well adapted to the growth of submicron layers and heterostructures.

Open-tube flow systems are used at atmospheric or reduced pressures in producing the III-V alloys. The process requires only one high-temperature zone for the in situ formation and growth of the semiconductor compound directly on a heated substrate.

Low pressure (LP-) MOCVD growth method offers an improved thickness uniformity and compositional homogeneity, reduction of autodoping, reduction of parasitic decomposition in the gas phase, and allows the growth of high-quality material over a large surface area. The LP-MOCVD technique has been successfully used to grow an InAsSb/InAsSbP alloy on an InAs substrate. InAsSbP alloys, which are potentially useful materials both for heterojunction microwave and optoelectronic device applications can be grown by liquid-phase epitaxy (LPE), molecular-beam epitaxy (MBE), conventional vapor-phase epitaxy (VPE), as well as MOCVD and MOMBE.

While each of the above processes are viable, certain disadvantages exist; for example, LPE experiences growth problems with InAsSbP alloys and potential nonuniform growth as well as melt-back effect. Molecular-beam epitaxy is a very expensive and complex process, and difficulties have been reported with p-type doping and with the growth of phosphorus-bearing alloys. Vapor-phase epitaxy disadvantages include potential for hillock and haze formation and interfacial decomposition during the preheat stage.

The technique of LP-MOCVD is well adapted to the growth of the entire composition range of InAsSbP layers of uniform thickness and composition on InAs substrates. This results first from the ability of the process to produce abrupt composition changes and second from the result that the composition and growth rate are generally temperature independent. It is a versatile technique, numerous starting compounds can be used, and growth is controlled by fully independent parameters.

The high quality of double heterostructure laser diodes based on the InAsSb/InAsSbP alloy on InAs substrate (100) grown by MOCVD is known which shows low threshold current density and a high output power. However, for the InAsSb/InAsSbP system it is important to have a system which can be reliably connected to other components of the device in which the laser is situated. The most common film used in passivation of III-V semiconductor devices is $SiO_2$ for its simplicity in chemical properties. However, the properties of $SiO_2$ film often leads to poor uniformity and film adhesion problems during processing.

Wet chemical etching methods are being used increasingly in the fabrication if III-V semiconductor lasers for mesa formation, pin holes and other pattern transfer steps. Most devices use dry etching techniques to obtain vertical sidewalls and deep mesas. Dry etching offers many advantages over wet etching for device fabrication, including better dimensional control and superior uniformity. The disadvantages are the much higher capitol equipment cost and, to a lesser extent, the question of damage in the semiconductor surface.

In semiconductor lasers, most applications often require lasers to operate in a single mode, generate a relatively high power condition or to provide special lasing characteristics. Lasers of this type are fabricated by specific design structure which often requires the etching of multiple semiconductor layers. The fabrication of index guided InAsSbP/InAsSb/InAs lasers is usually complicated and requires several stages.

The type-II InAs/GaSb superlattice has demonstrated the ability to perform infrared imaging in the Long and Middle Infra-Red Range (MWIR and LWIR). However, its performances are limited between 8 and 12 µm by its $R_oA$ and the absence of a passivation technique with the ability to efficiently protect the sample from degrading due to the aggressive steps in the Focal Plane Array (FPA) fabrication. The FPA process includes steps such as flip-chip bonding and underfill that apply considerable stress on the devices. Several passivation techniques have been proposed, but all of them present significant disadvantages. In the LWIR, $SiO_2$ passivation layers degrade the electrical performances of homojunction diodes by several orders of magnitude. Sulfide based passivation layers are too thin and volatile to mechanically protect the diodes. Epitaxial overgrowth of wide band gap $Al_xGa_{1-x}As_ySb_{1-y}$ is complex and expensive.

Surface leakage is the consequence of the abrupt termination of the periodic structure of the superlattice that creates a bending of the bands at the surface of the semiconductor. In the proximity of the mesa sidewalls, this bending can provoke an accumulation of charges, eventually leading to a local inversion of the majority carriers in the superlattice. This may result in the creation of a strong current along the sidewalls, shorting the p-n junctions. The presence of process contaminants or native oxides can also modify the surface potential and create trap levels in the energy gap, increasing the trap-assisted tunneling currents. The passivation is supposed to reduce the surface leakage currents by fixing the Fermi level at the surface of the material, thus preventing any undesired bending of the conduction or the valence bands.

The surface passivation of type-II InAs/GaSb superlattice photodiodes has been a limiting factor to the incorporation of this technology in infrared imaging systems and has been a known process technology challenge for a number of years. The narrow band gap of long-wavelength infrared (LWIR) photodiodes and a highly reactive surface lead to Fermi level pinning at the surface of type-II sperlattice mesa diodes, resulting in deleterious surface-related tunneling currents and reduces, zero-biad detector impedance. Moreover, foreign absorbents and process contaminants can further alter the surface potential and introduce trap levels within the energy gap, leading to more efficient trap-assisted tunneling currents.

Demonstrating chemical, chalcogen-based passivation, dielectric passivation, and high band gap, semiconductor regrowth passivation has been demonstrated through surface passivation. The chalcogen-based passivation, though initially effective, does not address the practical issue of physical protection and encapsulation of the device, and there have been reports of the temporal instability of such a passivation layer. Dielectric passivation or type-II superlattice photodiodes presents the challenge of developing high-quality, low-fixed, and interfacial charge density dielectrics at process temperatures substantially below the material growth temperature, such that superlattice period intermixing does not occur. One solution is the subsequent regrowth of a lattice-matched, large band gap semiconductor over etched mesa diodes. This technique, however, requires very careful surface cleaning and preparation prior to the regrowth step and its feasibility in very high fill-factor focal plane arrays (FPAs) has not been demonstrated. This application presents an effective surface preparation and passivation technique, based on polyimide encapsulation, which aims to address the process technology challenges for type-II InAs/GaSb superlattice photodiodes and focal plane arrays.

Conformal polyimide (PI) physically passivates and protects the underlying semiconductor from the ambient environment while maintaining or even improving the electrical performance of the device measured prior to passivation. A number of groups have reported on the passivating behavior of polyimides in InGaAs/InP, GaAs, and AlGaAsSb/InGaAsSb/GaSb material systems and devices but no such investigations have been conducted with respect to InAs/GaSb superlattices nor on devices with band gaps smaller than ~550 meV.

SUMMARY OF THE INVENTION

The subject invention comprises a superlattice photodiode with polyimide surface passivation. Nearly bulk-limited electrical performance in type-II InAs/GaSb superlattice photodiodes can be achieved with proper surface preparation followed by polyimide encapsulation, while also providing physical protection of the underlying semiconductor. The surface resistivity of polyimide passivated photodiodes can be increased at least one order of magnitude compared to as-processed devices. This process has been demonstrated to be compatible with mesa dimensions and pitches found in typical FPA fabrication processes. The polyimide passivation can be shown to be stable upon exposure to various ambient conditions, as well as over time. This passivation technique has promising implications for the practical realization of infrared imaging sensors based on type-II InAs/GaSb superlattices.

CONCISE DESCRIPTION OF THE DRAWINGS

DETAILED DESCRIPTION OF THE PREFERRED EMBODIMENT

The superlattice photodiodes can be fabricated from material grown in a Varian Gen II solid source molecular beam epitaxy system and grown on a 2 in. p-type GaSb wafer. In one embodiment, a superlattice design of 13 ML InAs and 7 ML of GaSb was chosen with a nominal cutoff wavelength of 11.1 μm. The exemplary structures consisted of an ~0.75 μm thick GaSb:Be p$^+$ (p~10$^{18}$ cm$^{-3}$) buffer layer, followed by a 0.5 μm thick p$^+$ (p~10$^{18}$ cm$^{-3}$) InAs/GaSb:Be SL, a ~2 μm thick active region was doped lightly p type with beryllium (p~10$^{15}$ cm$^{-3}$), a 0.5 μm thick n$^+$ (n~10$^{18}$ cm$^{-3}$) InAs:Si/GaSb SL, and finished with a highly doped n$^+$ (n~10$^{18}$ cm$^{-3}$) InAs contact layer. The thicknesses of the InAs/GaSb SL regions, for the four samples, were 0.3, 1, 2, and 3 μm, for SL-A, SL-B, SL-C, and SL-D, respectively.

Diode mesas can be isolated using UV photolithography and electron-cyclotron resonant-reactive ion etching in a BCl$_3$-based etch chemistry, followed up with a short, citric acid-based wet etch. Subsequently, top and bottom contacts of Ti/Pt/Au can be deposited. Two mask sets were used in the subsequent example, containing devices with perimeter to area ratios ranging from 100 to 400 cm$^{-1}$ and 100 to 1600 cm$^{-1}$, respectively. After each photoresist strip step, a thorough, pressurized solvent cleaning was carried out. All current-voltage (I-V) measurements were conducted with a cold, dark shield limiting the field of view of the devices under test.

EXAMPLE

Figure 1A:
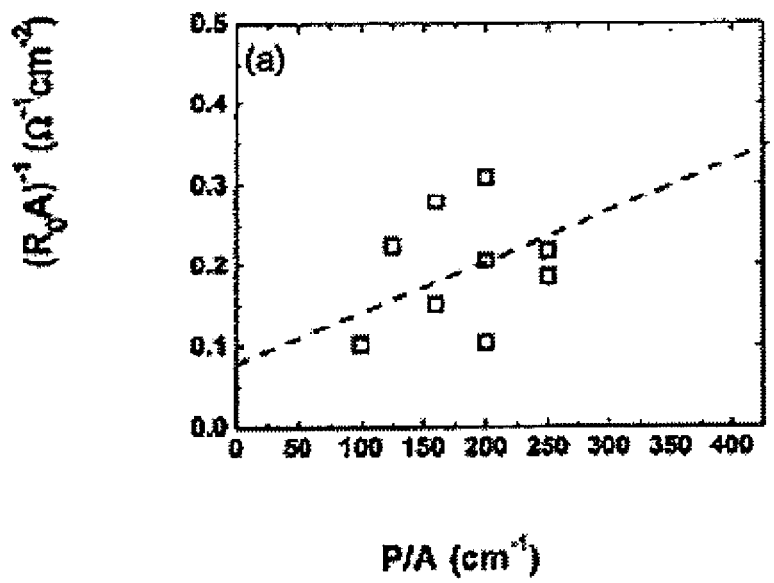
FIG. 1(a) depicts a plot of the inverse of the zero-bias resistance area product versus the perimeter to area ratio for an unprocessed die.

FIG. 1(a) shows a plot of the inverse of the zero-bias resistance area product versus the perimeter to area ratio for unpassivated diodes (sample A), measured immediately after the last cleaning step of the fabrication process. A considerable degree of nonuniformity in the $R_oA$ value at 77 K was observed. A linear least squares fitting (LLSF) was conducted while fixing the bulk $R_oA$ value (P/A=0) to 12.4 Ω·cm$^2$, as extracted from a LLSF of a more uniform distribution of experimental values [FIG. 1(c)]. The surface resistivity was extracted to be 1.6×10$^3$ Ωcm.

Figure 1B:
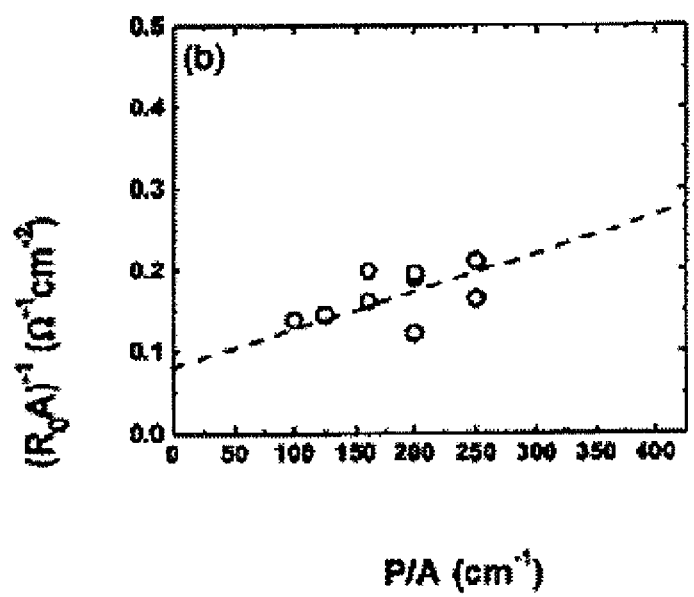
FIG. 1(b) depicts a plot of the inverse of the zero-bias resistance area product versus the perimeter to area ratio for an unprocessed die after a 12 hour vacuum desorption.

The same sample was then warmed to room temperature and allowed to remain under a vacuum of approximately 10$^{-3}$ Torr, for 12 hours, after which time it was cooled to 77 K and measured again (sample B). FIG. 1(b) shows the resulting $(R_oA)^{-1}$ values. The fitting of these data resulted in a slightly higher surface resistivity of 2.1×10$^3$ Ωcm than the as-processed sample, and the standard deviation of the $R_oA$ values decreased from 2.6 to 1.2 Ωcm$^2$. It is believed that process contaminants are being desorbed from the mesa sidewall surface during the room temperature vacuum treatment, as evidenced by the increase of the surface resistivity.

Figure 1C:
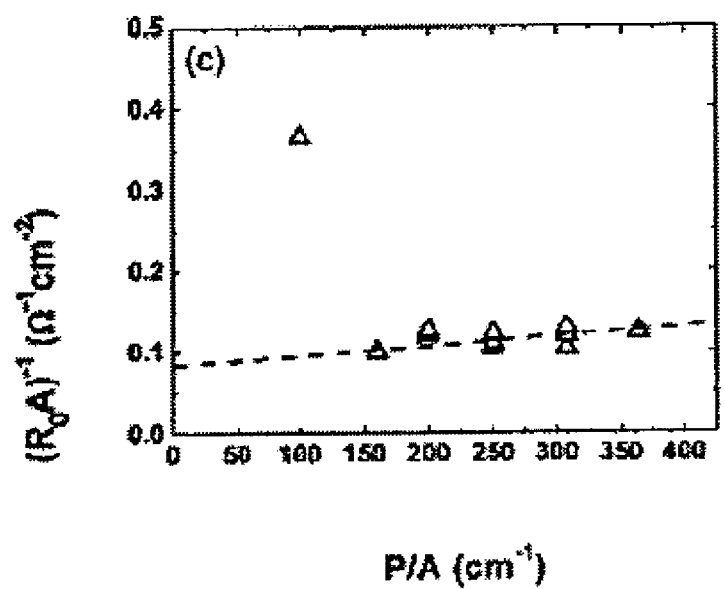
FIG. 1(c) depicts a plot of the inverse of the zero-bias resistance area product versus the perimeter to area ratio for another die from the same processing run as in FIG. 1(b) after a 288 hour vacuum desorption.

Another die, from the same processing run, was kept in vacuum for 288 hours and then bonded and tested (sample C), the results of which are shown in FIG. 1(c). A significant increase of the surface resistivity, by approximately a factor of 5 ($r_{surf}$=8.3×10$^3$ Ωcm), compared to the as-processed diodes, was observed (excluding the data point at 100 cm$^{-1}$).

This suggests that a prolonged vacuum desorption step can assist in the removal of adsorbants that negatively affect the surface potential.

While the vacuum desorption of LWIR InAs/GaSb superlattice photodiodes was shown to be effective in preparing a low-leakage and high electrical uniformity device, a physically insulating passivant is necessary to protect the diode from degrading due to ambient exposure and further fabrication processes. Ideally, this passivant should not alter the electrical behavior of the device from its unpassivated state and/or it should exhibit properties that improve the behavior of the unpassivated device. For this task, an aromated heterocyclic polyimide, such as Pyralin® Polyimide (PI-2555, HD Microsystems) can be used to act as a protective insulating layer. Pyralin® Polyimide is a copolymer of Benzophenone Tetracarboxylic Dianhydride, and 4,4-Oxydianiline and m-Phenylenediamine. This particular polyimide was chosen for its low imidization temperature and time, low elastic modulus (2.4 GPa), high resistivity ($10^{15} \Omega$), and good step coverage. For some experiments the PI was spun directly onto the wire bonded sample; otherwise, vias were etched in the PI using an oxygen plasma. The imidization was carried out with gradual ramping of the temperature to 180° C., in order to avoid cracks and voids in the passivation layer, and curing for about 45 minutes.

Figure 1D:
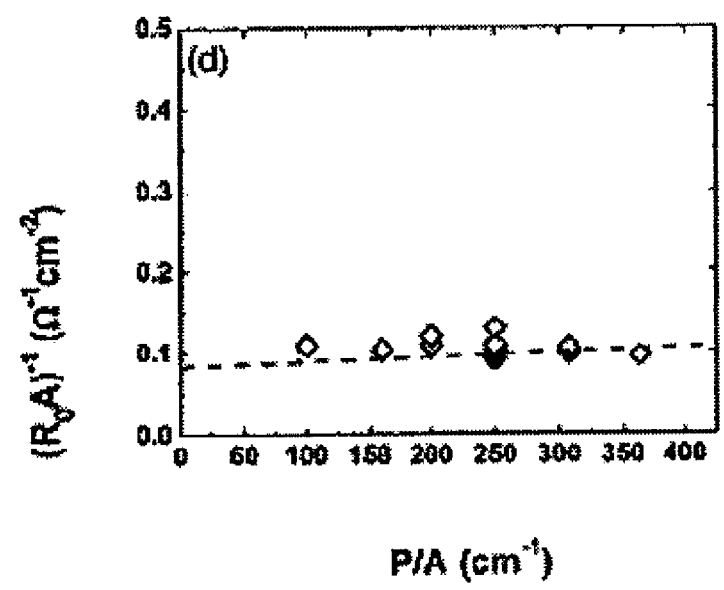
FIG. 1(d) depicts a plot of the inverse of the zero-bias resistance area product versus the perimeter to area ratio for the same die as in FIG. 1(c) but with 2 μm of polyimide passivation spun onto the sample.

Polyimide was spun onto sample C, allowed to cure, and then I-V curves were taken at 77 K (sample D). In one embodiment, the polyimide passivation layer is about 2 μm thick. The resulting $(R_oA)^{-1}$ values versus P/A are shown in FIG. 1(d). The $R_oA$ values and their uniformity improved yet further after polyimidization. The surface resistivity, as determined by LLSF, increased to $1.4 \times 10^4$ $\Omega$cm, nearly an order of magnitude higher than the as-processed, unpassivated photodiodes, and the diodes exhibited a standard deviation of 0.85 $\Omega$cm$^2$. Though using a LLSF is a systematic, quantitative approach to characterizing the leakage current using variable area data, it could be argued that the fit values for surface resistivity understate the actual resistivity due to small, varying degrees of dispersion in the data. Nonetheless, polyimide clearly has clearly improved the nature of the surface leakage in these devices.

Figure 2:
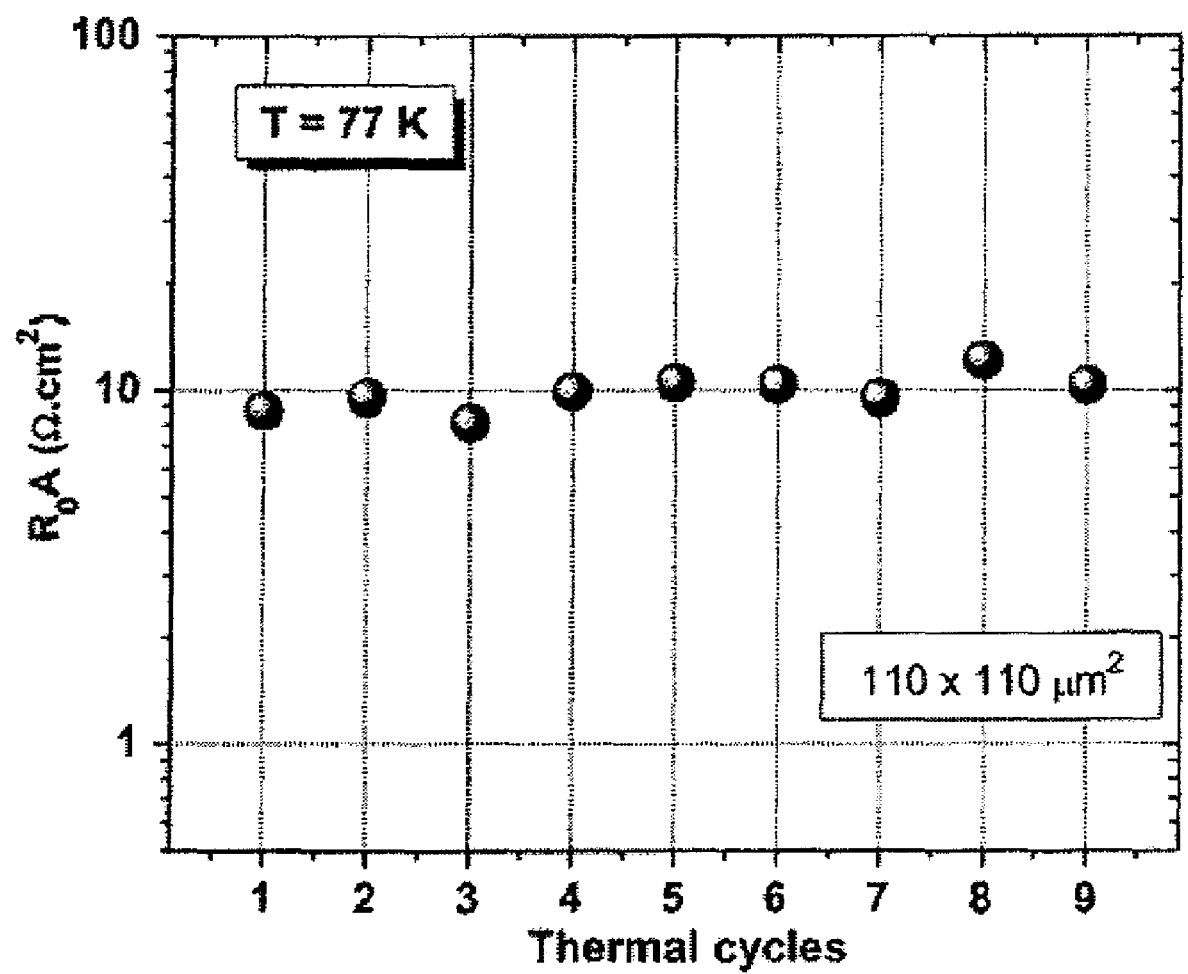
FIG. 2 depicts a plot of the $R_oA$ of a representative diode from the test die as a function of thermal cycle.

The same test die from FIG. 1(d) was subjected to a series of thermal cycles, nine in total from 300 to 77 K, and various treatments in order to observe the effects of environment and time on the electrical performance of the devices. The $R_oA$ of a representative diode from the test die is plotted as a function of thermal cycle in FIG. 2. Thermal cycles 1 and 2 were conducted prior to the polyimide passivation. Thermal cycle 3 was immediately conducted after the imidization of the polyimide. Thermal cycle 4 was measured after keeping the sample in vacuum for 16 hours. Thermal cycle 5 was conducted after submerging the sample in water for 30 minutes and blow drying it with dry $N_2$. As a point of comparison, some plasma-enhanced chemical vapor deposition $SiO_2$ passivated LWIR photodiodes have exhibited varying passivation performance depending upon moisture uptake of the passivating layer (not shown). This behavior is believed to arise from compressive stress imparted to the $SiO_2$ thin film due to the electrostatic interaction of water molecules trapped in pores of the low-density $SiO_2$. However, no appreciable change in the electrical performance, nor uniformity, of polyimide passivated superlattice photodiodes was observed, regardless of pretreatment of the passivated sample prior to measurement. Thermal cycle 6 was then measured immediately after the previous cycle. Thermal cycles 7, 8, and 9 were measured after 4, 21 and 28 more days in laboratory atmosphere (~23° C. and ~35% relative humidity), respectively.

The $R_oA$ values ranged between 8.1 and 12.2 $\Omega$cm$^2$ and stabilized around 10.4 $\Omega$cm$^2$. According to the plotted data, as well as observations of other similarly passivated LWIR dies, the diodes' zero bias, as well as reverse bias, leakage behavior improves slightly over time until it reaches some equilibrium, near bulk value. This may be a result of the reduction of some oxides on the mesa sidewall due to non-completely cured polyamic acid, as observed during the initial passivation of this sample. Additionally, polyimide has very little fixed insulator charge density, as indicated by a small flatband voltage shift and lack of hysteresis in polyimide metal-insulator semiconductor structures measured via the capacitance-voltage technique. This may suggest that the electrostatic, surface potential imparted upon the mesa sidewall by the encapsulating polyimide insulator is significantly small enough such that this particular characteristic of the polyimide has no deleterious effects on the I-V behavior of the diode.

Figure 3:
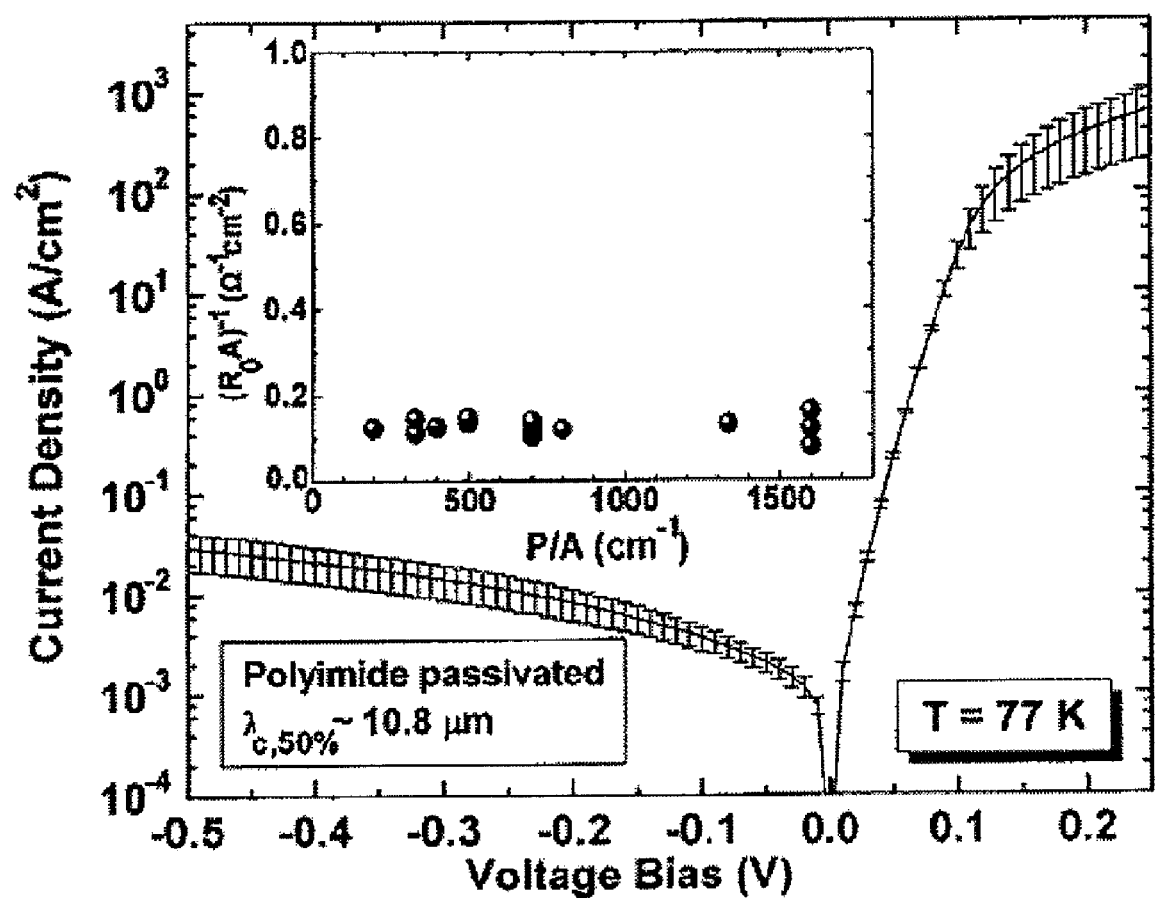
FIG. 3 depicts a plot of the average of the current, as well as the standard deviation, for ten representative, FPA-sized diodes, ranging from 25 to 55 μm on a side, from a polyimide passivated "miniarray" die.

In order to extend this work to even smaller length scales, on the order of FPA-sized pixels, a second processing run was conducted using a mask consisting of groupings of diode arrays ranging in size from 400 to 25 μm on a side with 2 and 3 μm spaces between mesas. Compared to regrowth and dielectric passivation techniques, polyimide passivation offers the advantage of being spun onto the sample or wafer. This allows for filling of the gaps between high fill-factor mesas or contacting reentrant profiles, whereas a physical deposition or evaporationlike technique could experience shadowing or "necking" in such structures. Diodes were accessed electrically via a bridge contact running over the polyimide passivation to a large bond bad. For imaging applications, detector arrays are often operated at a small reverse bias (<300 mV), and thus it is crucial to maintain excellent uniformity in the dark current such that the utilization of the dynamic range for all pixels can be maximized. FIG. 3 shows the average of the current, as well as the standard deviation, for ten representative, FPA-sized diodes, ranging from 25 to 55 μm on a side, from a polyimide passivated "miniarray" die. The standard deviation of the current density increases monotonically to a value of only $5.4 \times 10^{-3}$ A/cm$^2$ at a bias voltage of −0.3 V. The inset of FIG. 3 shows the P/A distribution of the inverse $R_oA$ product for polyimide passivated diodes of down to 25×25 μm$^2$ in size. No clear surface dependence was observed and the diodes' $R_oA$ values all fell within the range of approximately 6-13 $\Omega$m$^2$.

It is shown that with proper surface preparation practices followed by polyimide encapsulation, nearly bulk-limited electrical performance in type-II InAs/GaSb superlattice photodiodes can be achieved while providing physical protection of the underlying semiconductor. The surface resistivity of polyimide passivated photodiodes can be increased at least one order of magnitude compared to as-processed devices. This process has been demonstrated to be compatible with mesa dimensions and pitches found in typical FPA fabrication processes. The polyimide passivation can be shown to be stable upon exposure to various ambient conditions, as well as over time. This passivation technique has promising implications for the practical realization of infrared imaging sensors based on type-II InAs/GaSb superlattices.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims.

Various features of the invention are set forth in the following claims.

What is claimed is:

1. A method of passivating type-II InAs/GaSb superlattice photodiodes, comprising depositing a passivation layer consisting of polyimide on the whole of said type-II InAs/GaSb superlattice photodiode.

2. The method of claim 1, including the steps of:
doping a 2 μm thick active region of a p-type GaSb base layer;
isolating a plurality of diode mesas;
etching the diode mesas;
depositing a top and a bottom contact on the superlattice photodiode;
depositing a passivation layer of polyimide while gradually ramping the temperature to 180° C.; and
curing the superlattice photodiode for 45 minutes.

3. The method in claim 2 wherein the 2 μm thick active region is doped lightly p-type with beryllium ($p\sim10^{15}$ cm$^{-3}$).

4. The method of claim 2 wherein the top and the bottom contacts comprise Ti.

5. The method of claim 2 wherein the top and the bottom contacts comprise Pt.

6. The method of claim 2 wherein the top and the bottom contacts comprise Au.

7. The method of claim 2 wherein depositing the polyimide passivation layer consists of spinning the polyimide directly onto the wire bonded sample.

8. The method of claim 2 wherein depositing the polyimide passivation layer comprises etching vias in the polyimide passivation layer using an oxygen plasma.

9. The method of claim 2 wherein the superlattice photodiode contains devices with perimeter-to-area ratios ranging from 100 to 400 cm$^{-1}$.

10. The method of claim 2 wherein the superlattice photodiode contains devices with perimeter-to-area ratios ranging from 100 to 1600 cm$^{-1}$.

11. The method of claim 2 wherein the superlattice photodiode contains a plurality of groupings of diode arrays ranging in size from 400 to 25 μm on a side, with 2 and 3 μm spaces between mesas.

12. The method of claim 2 wherein the passivation layer of polyimide has a thickness of about 2 μm.

13. The method of claim 2 wherein the polyimide passivation layer comprises a copolymer polyimide of Benzophenone Tetracarboxylic Dianhydride and 4, 4-Oxydianiline and m-Phenylenediamine.

14. An infrared imaging device, comprising:
a substrate;
a type-II superlattice photodiode grown on the substrate;
a plurality of diode mesas created by using UV photolithography and electron-cyclotron resonant-reactive ion etching in a BCl$_3$-based etch chemistry
a plurality of top and bottom contacts deposited on the superlattice structure; and
a 2 μm-thick polyimide passivation layer of polyimide spun on the entire surface of the infrared imaging device.

15. The infrared imaging device of claim 14, wherein the substrate is p-type GaSb.

16. The infrared imaging device of claim 14, wherein the superlattice contains a 2 μm-thick active region, where the active region is doped lightly p-type with beryllium ($p\sim10^{15}$ cm$^{-3}$).

17. The device of claim 14 wherein the top and the bottom contacts comprise Ti.

18. The device of claim 14 wherein the top and the bottom contacts comprise Pt.

19. The device of claim 14 wherein the top and the bottom contacts comprise Au.

20. The device of claim 14 wherein the polyimide is an aromatic heterocyclic polyimide.

* * * * *